United States Patent
Ogihara et al.

(10) Patent No.: US 10,865,332 B2
(45) Date of Patent: Dec. 15, 2020

(54) EPOXY RESIN COMPOSITION AND ELECTRONIC COMPONENT DEVICE

(71) Applicant: Hitachi Chemical Company, Ltd., Tokyo (JP)

(72) Inventors: Hirokuni Ogihara, Ibaraki (JP); Fumio Furusawa, Ibaraki (JP); Shinya Nakamura, Ibaraki (JP); Takatoshi Ikeuchi, Ibaraki (JP); Takashi Yamamoto, Ibaraki (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 445 days.

(21) Appl. No.: 14/347,901

(22) PCT Filed: Sep. 27, 2012

(86) PCT No.: PCT/JP2012/074960
§ 371 (c)(1),
(2) Date: Mar. 27, 2014

(87) PCT Pub. No.: WO2013/047696
PCT Pub. Date: Apr. 4, 2013

(65) Prior Publication Data
US 2014/0234633 A1   Aug. 21, 2014

(30) Foreign Application Priority Data

Sep. 29, 2011  (JP) .................................. 2011-215338

(51) Int. Cl.
*C09J 163/00* (2006.01)
*C08L 63/00* (2006.01)
(Continued)

(52) U.S. Cl.
CPC ........ *C09J 163/00* (2013.01); *C08G 59/3218* (2013.01); *C08G 59/621* (2013.01);
(Continued)

(58) Field of Classification Search
CPC ....... H01L 2924/00; H01L 2224/45144; H01L 2924/00014; H01L 2924/10253;
(Continued)

(56) References Cited

U.S. PATENT DOCUMENTS

| | | | | |
|---|---|---|---|---|
| 6,255,409 B1 * | 7/2001 | Matsuoka | .......... | C08G 59/3218 257/793 |
| 2005/0253286 A1 * | 11/2005 | Yoshikawa | .......... | C08G 59/621 257/787 |

(Continued)

FOREIGN PATENT DOCUMENTS

| CN | 102167886 A | 8/2011 |
|---|---|---|
| EP | 0682052 A1 | 11/1995 |

(Continued)

OTHER PUBLICATIONS

Ikezawa et al., machine Translation of JP 2009/221357, Oct. 1, 2009. (Year: 2009).*

(Continued)

*Primary Examiner* — John D Freeman
(74) *Attorney, Agent, or Firm* — Fitch, Even, Tabin & Flannery, LLP

(57) ABSTRACT

An epoxy resin composition includes: (A) an epoxy resin containing a compound represented by the following Formula (I); (B) a phenol resin containing a compound represented by the following Formula (II); and (C) a dihydroxynaphthalene compound containing a compound represented by the following Formula (III). In Formula (I), R represents a hydrogen atom, and n represents an integer from 0 to 10. In Formula (II), $R^1$ represents a hydrogen atom, an alkyl group having from 1 to 6 carbon atoms, or an alkoxy group having 1 or 2 carbon atoms, and each $R^1$ may be the same as or different from another $R^1$. n represents an integer from 0 to 10. In Formula (III), $R^1$ represents a hydrogen atom, an alkyl group having from 1 to 6 carbon atoms, or an alkoxy group having 1 or 2 carbon atoms.

(Continued)

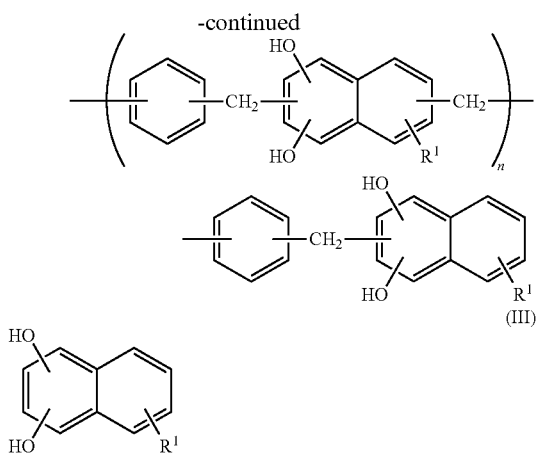

12 Claims, 3 Drawing Sheets

(51) Int. Cl.
*H01L 23/29* (2006.01)
*C08G 59/32* (2006.01)
*C08G 59/62* (2006.01)

(52) U.S. Cl.
CPC ............ *C08L 63/00* (2013.01); *H01L 23/293* (2013.01); *H01L 2924/181* (2013.01); *Y10T 428/31511* (2015.04)

(58) Field of Classification Search
CPC . H01L 2924/12041; H01L 2924/12042; H01L 2924/1301; H01L 2924/181; H01L 2224/05599; H01L 2924/00015; H01L 2224/16225; H01L 2224/16245; H01L 2224/48227; H01L 2224/48247; H01L 23/29; H01L 24/16; H01L 24/45; H01L 24/48; H01L 2924/15311; H01L 23/293; C08G 59/3218; C08G 59/621; C08L 63/00; C09J 163/00; H05K 5/06; Y10T 428/31511
See application file for complete search history.

(56) References Cited

U.S. PATENT DOCUMENTS

| | | | | |
|---|---|---|---|---|
| 2006/0167189 A1* | 7/2006 | Mizuno | ................... | B32B 15/08 525/396 |
| 2007/0295607 A1* | 12/2007 | Kawai | .................. | C07D 303/00 205/164 |
| 2009/0062460 A1* | 3/2009 | Nakamura | ............. | C08G 59/68 524/611 |
| 2011/0120761 A1* | 5/2011 | Kawai | .................. | H05K 1/0353 174/258 |
| 2012/0292774 A1* | 11/2012 | Itoh | ......................... | H01L 24/05 257/769 |
| 2013/0009327 A1* | 1/2013 | Tanaka | ............... | C08G 59/3218 257/789 |

FOREIGN PATENT DOCUMENTS

| | | | |
|---|---|---|---|
| JP | 06-145309 A | | 5/1994 |
| JP | 08-143647 A | | 6/1996 |
| JP | 2003-128878 A | | 5/2003 |
| JP | 2004-300431 A | | 10/2004 |
| JP | 2005-002227 A | | 1/2005 |
| JP | 2006124418 A | | 5/2006 |
| JP | 2009108301 A | | 5/2009 |
| JP | 2009-221357 | | 10/2009 |
| JP | 2009221357 A | * | 10/2009 |
| JP | 2012107145 A | | 6/2012 |
| WO | 2010/150487 A1 | | 12/2010 |
| WO | WO-2011093038 A1 | * | 8/2011 ....... H01L 23/49503 |
| WO | WO2011114687 | * | 9/2011 |

OTHER PUBLICATIONS

"Complete works on sealing techniques and material development in the latest semiconductor and LED," Technical Information Institute Co., Ltd. (2006), pp. 22-24 in Japanese, 2 pages in English.

Office Action of Chinese Appln. No. 201280047389.4 dated Jul. 7, 2015 with partial English translation.

Office Action Taiwan Patent Appln. No. 10421656890 dated Dec. 4, 2015 with partial English translation.

International Search Report, from International Bureau, issued in corresponding International Application No. PCT/JP2012/074690, dated Dec. 11, 2012, 2 pages in Japanese, 2 pages in its English translation.

Written Opinion of the International Searching Authority, issued in issued in corresponding International Application No. PCT/JP2012/074690, dated Dec. 11, 2012, 4 pages in Japanese.

Office Action issued in Japanese Appln. No. 2013-536404 dated Apr. 12, 2016 with English translation.

* cited by examiner time (min)

EPOXY RESIN COMPOSITION AND ELECTRONIC COMPONENT DEVICE

TECHNICAL FIELD

The present invention relates to an epoxy resin composition and an electronic component device.

BACKGROUND ART

Hitherto, curable resins such as epoxy resins are widely used in fields such as molding materials, materials for laminates and adhesives, various kinds of electronic and electrical components, and coating and ink materials. In particular, cured products of epoxy resins are widely used as sealing materials in the field related to the sealing technique of electronic component elements such as a transistor and an IC. The reason for that is because that cured products of epoxy resins are balanced in properties such as moldability, electrical properties, moisture resistance, heat resistance, mechanical properties, and adhesion with insert products.

Meanwhile, in recent years, increase in speed and density has been advanced in the electronic component field, and thus heat generation from electronic components has been remarkable. Electronic components operated under a high temperature environment, for example in-vehicle applications, have been increased in number. Hence, a requirement of improvement in reliability related to a use under a high temperature environment, for example changes in physical properties being small in degree even in a use under a high temperature environment compared to a use under room temperature, has been increased to the plastics, particularly cured products of epoxy resins, which are used for electronic components.

Here, as a method of improving reliability under a high temperature environment, there is a method, in which glass transition temperature is elevated. As the method of elevating glass transition temperature, a method using a trisphenolmethane type epoxy resin together with a phenol novolac, and the like has been reported (for example, see Complete Works on sealing techniques and material development in the latest semiconductor and LED (TECHNICAL INFORMATION INSTITUTE CO., LTD), pp. 22-24 (2006)). According to this method, it is regarded that the glass transition temperature of a cured product of an epoxy resin can be elevated to about 200° C. or so and thus high heat resistance can be imparted. In addition, a method using a polyfunctional epoxy resin such as a trisphenolmethane type epoxy resin together with a polyfunctional phenol resin such as a trisphenolmethane type phenol resin is also known as a method elevating a glass transition temperature to about 200° C. or so.

In addition, a composition containing a dihydroxynaphthalene aralkyl phenol resin is suggested as an epoxy resin composition for sealing, of which the curvature is small in a BGA package, the temperature change of the curvature at from room temperature (25° C.) to the reflow temperature is small in degree, the defects at the time of second mounting are few, and the fluidity is favorable, in which the occurrence of defects such as a void and a gold wire flow is not frequent, and reliability such as moldability, moisture resistance, and high temperature exposure property does not decrease, which is non-halogen and non-antimony, and of which the flame retardance is favorable (for example, see Japanese Patent Application Laid-Open (JP-A) No. 2009-221357).

SUMMARY OF INVENTION

Technical Problem

However, the present inventors conducted investigations, and as a result, the following fact is demonstrated. A cured product of a composition containing a trisphenolmethane type epoxy resin of the related art exhibits a high glass transition temperature, but the elastic modulus thereof is significantly decreased at near 200° C. Hence it cannot be said that the reliability thereof under a high temperature environment of, for example, 200° C. is sufficient. In the market, an epoxy resin composition excellent in reliability that the change in physical properties of a cured product is small in degree even in a use under a high temperature environment is strongly desired.

Therefore, an object of the present invention is to provide an epoxy resin composition that exhibits a high glass transition temperature when formed as a cured product, and that exhibits a minor change in elastic modulus and a minor decrease in mass even when used in a high temperature environment, and an electronic component device provided with an element sealed by the epoxy resin composition.

Means for Solving Problems

The inventors have conducted intensive investigations in order to solve the problems described above, and as a result, have found out that a cured product of an epoxy resin composition containing a particular epoxy resin and a particular phenol resin exhibits a high glass transition temperature, a little change in elastic modulus and a little decrease in mass even in a use under a high temperature environment, and an excellent reliability under a high temperature environment, thereby reaching to complete the present invention. Specifically, the present invention relates to the following aspects.

<1> An epoxy resin composition, including: (A) an epoxy resin containing a compound represented by the following Formula (I); (B) a phenol resin containing a compound represented by the following Formula (II); and (C) a dihydroxynaphthalene compound containing a compound represented by the following Formula (III).

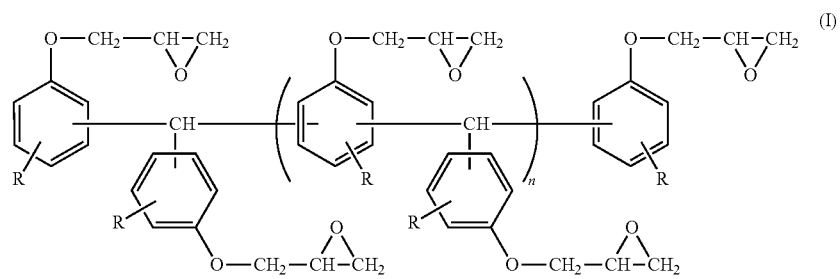

In Formula (I), R represents a hydrogen atom, and n represents an integer from 0 to 10.

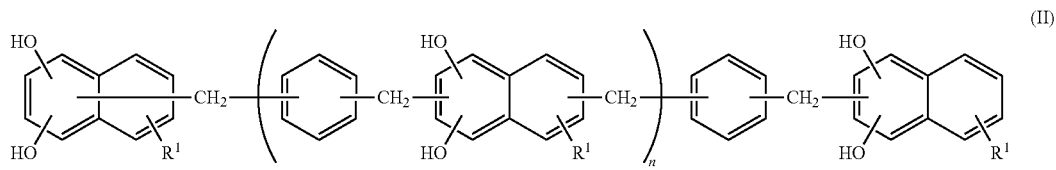

In Formula (II), $R^1$ represents a hydrogen atom, an alkyl group having from 1 to 6 carbon atoms, or an alkoxy group having 1 or 2 carbon atoms, and each $R^1$ may be the same as or different from another $R^1$. n represents an integer from 0 to 10.

In Formula (III), $R^1$ represents a hydrogen atom, an alkyl group having from 1 to 6 carbon atoms, or an alkoxy group having 1 or 2 carbon atoms.)

<2> The epoxy resin composition according to <1>, in which the compound represented by Formula (II) contains a phenol resin represented by the following Formula (IV).

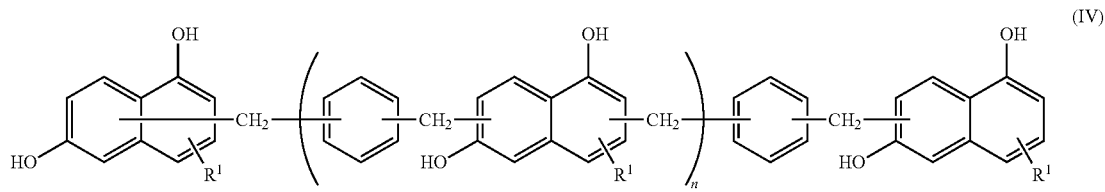

In Formula (IV), $R^1$ represents a hydrogen atom, and n represents an integer from 0 to 10.

<3> The epoxy resin composition according to <1> or <2>, in which a content of a total amount of the compound represented by Formula (III) with respect to a total amount of the compound represented by Formula (II) and the compound represented by Formula (III) is from 10% by mass to 55% by mass.

<4> The epoxy resin composition according to any one of <1> to <3>, further containing an antioxidant.

<5> An electronic component device, containing an element sealed by the epoxy resin composition according to any one of <1> to <4>.

Advantageous Effects of Invention

According to the present invention, it is possible to provide an epoxy resin composition that exhibits a high glass transition temperature when formed as a cured product, and that exhibits a minor change in elastic modulus and a minor decrease in mass even when used in a high temperature environment, and an electronic component device excellent in reliability under a high temperature environment.

DESCRIPTION OF EMBODIMENTS

Figure 1:
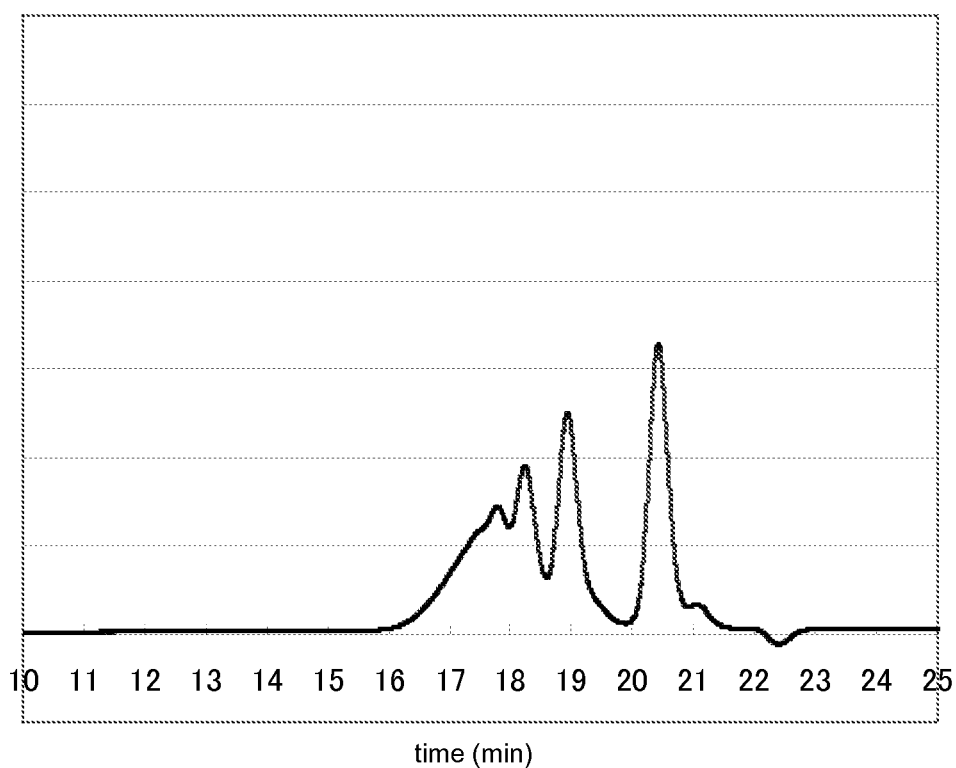
FIG. 1 is a GPC chart for phenol resin 1.

Hereinafter, the present invention will be described in detail.

Meanwhile, "to" in the specification denotes the range including the numerical values written before and after "to" as the minimum value and the maximum value, respectively. In addition, the amount of each of constituents in a composition in the specification means the total amount of the plural materials present in the composition unless otherwise stated in a case in which more than one material corresponding to each of the constituents are present in the composition.

<Epoxy Resin Composition>

The epoxy resin composition of the present invention is an epoxy resin composition containing (A) an epoxy resin containing a compound represented by the following Formula (I), (B) a phenol resin containing a compound represented by the following Formula (II), and (C) a dihydroxynaphthalene compound containing a compound represented by the following Formula (III). The epoxy resin composition of the present invention is solid at room temperature (25° C.).

Hereinafter, each of the constituents constituting the epoxy resin composition of the present invention will be described.

[(A) Epoxy Resin]

The epoxy resin composition used in the present invention contains a compound represented by the following Formula (I) (hereinafter, it will be referred to as a trisphenolmethane type epoxy resin.).

In Formula (I-1), R represents a hydrogen atom.

In terms of fluidity and heat resistance, the compound represented by Formula (I-1) is preferably contained at from 5% by mass to 90% by mass, more preferably contained at from 10% by mass to 80% by mass, and still more preferably contained at from 20% by mass to 70% by mass with respect to the total mass of the compound represented by Formula (I) and the compound represented by Formula (I-1).

An epoxy equivalent of the trisphenolmethane type epoxy resin represented by Formula (I), which includes the compound represented by Formula (I-1), is preferably from 100 to 220, more preferably from 120 to 200, and still more preferably from 140 to 185.

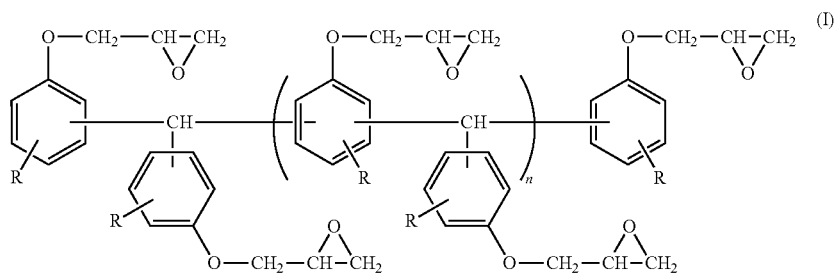

(I)

In Formula (I), R represents a hydrogen atom. n represents an integer from 0 to 10.

It is possible to improve particularly heat resistance in a case in which the epoxy resin composition contains the trisphenolmethane type epoxy resin. Since the trisphenolmethane type epoxy resin has a high content of aromatic ring in the resin structure and is polyfunctional, a cured product thereof exhibits a high glass transition temperature, and also, it is considered that it is possible to obtain a resin composition exhibiting a high reliability under a high temperature environment when formed as a cured product by combining with a phenol resin to be described below.

In a case in which R's in Formula (I) are a hydrogen atom, moldability is excellent. As the above described compound, in which R's are a hydrogen atom, a commercial product, for example, Trade name: EPPN-500 SERIES manufactured by NIPPON KAYAKU Co., Ltd. or Trade name: 1032H60 manufactured by Mitsubishi Chemical Corporation is affordable.

n in Formula (I) is an integer from 0 to 10 and preferably an integer from 0 to 8 in terms of fluidity and moldability.

Moreover, the compound represented by Formula (I) may contain a compound represented by the following Formula (I-1) used when the compound represented by Formula (I) is synthesized.

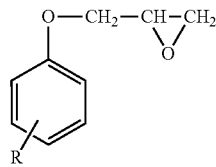

As a method of measuring the epoxy equivalent, a general method can be adopted. For example, the epoxy equivalent can be measured by a method based on JIS K7236.

In addition, another epoxy resin can be used together in the present invention in the range of not impairing the effect obtained using the trisphenolmethane type epoxy resin. The epoxy resin usable together with the trisphenolmethane type epoxy resin is not particularly limited as long as a compound has two or more epoxy groups in one molecule.

Examples of the epoxy resin usable together with the trisphenolmethane type epoxy resin include a bisphenol A type epoxy resin, a bisphenol F type epoxy resin, a bisphenol S type epoxy resin, a naphthalene type epoxy resin, a phenol novolac type epoxy resin, a cresol novolac type epoxy resin, a dihydroxybenzene novolac type epoxy resin, a phenol aralkyl type epoxy resin, a biphenyl type epoxy resin, a dicyclopentadiene type epoxy resin, a glycidyl ester type epoxy resin, a glycidylamine type epoxy resin, a hydantoin type epoxy resin, and an isocyanurate type epoxy resin. These epoxy resins may be used singly or in combination of two or more kinds thereof with respect to the trisphenolmethane type epoxy resin.

As a content in a case in which another epoxy resin is used together, the trisphenolmethane type epoxy resin is preferably 50% by mass or more, and more preferably 80% by mass or more in the total amount of epoxy resin. Excellent heat resistance can be obtained by setting the content of the trisphenolmethane type epoxy resin within the range described above.

[(B) Phenol Resin]

The epoxy resin composition used in the present invention contains a compound represented by the following Formula (II), hereinafter, it will be referred to as a naphthalenediol aralkyl resin.

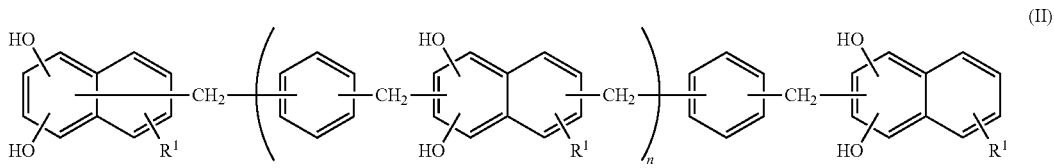

In Formula (II), $R^1$ represents a hydrogen atom, an alkyl group having from 1 to 6 carbon atoms, or an alkoxy group having 1 or 2 carbon atoms, and each $R^1$ may be the same as or different from another $R^1$. n represents an integer from 0 to 10.

Heat resistance particularly at a high temperature can be improved using the trisphenolmethane type epoxy resin together with the naphthalenediol aralkyl resin. The reason for this is considered as that the naphthalenediol aralkyl resin has a rigid structure of a naphthalene ring in the resin structure and is polyfunctional, and thus the glass transition temperature of a cured product is high. Moreover, it is considered that the restrictiveness of the molecular chain of the epoxy resin after curing reaction can be increased by two hydroxyl groups bonded to the naphthalene ring, and thus a resin composition having high reliability under a high temperature environment when formed as a cured product can be obtained by the combination with the epoxy resin described above.

In detail, since the trisphenolmethane type epoxy resin has a high content of aromatic ring and is polyfunctional, crosslink density can be increased by the reaction with a hydroxyl group of the naphthalenediol aralkyl resin. Moreover, the trisphenolmethane type epoxy resin can be stacked in a cured product by two hydroxyl groups bonded to a naphthalene ring of the naphthalenediol aralkyl resin, and further a stacking can be formed by the naphthalene ring of the naphthalenediol aralkyl resin. It is considered that the restrictiveness of the molecular chain can be effectively increased by these actions, and elastic modulus retention at a high temperature can be increased.

$R^1$s in Formula (II) represent a hydrogen atom, an alkyl group having from 1 to 6 carbon atoms, or an alkoxy group having 1 or 2 carbon atoms, and is preferably a hydrogen atom in terms of the property of elastic modulus retention.

n in Formula (II) is preferably an integer from 0 to 10, and more preferably an integer from 0 to 8 in terms of fluidity, moldability, and flame retardance.

In addition, a hydroxyl group in Formula (II) is preferably bonded to the 1-position and 6-position of a naphthalene structure in terms of achieving the effect of the present invention. Accordingly, the compound represented by Formula (II) is preferably a compound represented by the following Formula (IV).

In Formula (IV), $R^1$ represents a hydrogen atom. n represents an integer from 0 to 10, and the preferred range is the same as the preferred range of Formula (II).

As a 1,6-naphthalenediol aralkyl resin represented by Formula (IV), SN-375, SN-395 (both of them are trade names and manufactured by Nippon Steel Chemical Co., Ltd.), and the like are affordable.

In addition, another phenol resin can be used together in the present invention in the range of not impairing the effect obtained using the naphthalenediol aralkyl resin. As the usable phenol resin, a phenol resin generally used for an epoxy resin composition for sealing is exemplified, and there is no particular limitation.

Examples of the usable phenol resin include a novolac type phenol resin obtained by condensation or cocondensation of phenols such as phenol, cresol, resorcinol, catechol, bisphenol A, bisphenol F, phenylphenol, or aminophenol, and/or naphthols such as α-naphthol, β-naphthol, or dihydroxynaphthalene, and a compound having an aldehyde group such as formaldehyde, benzaldehyde, or salicylaldehyde in the presence of an acid catalyst; an aralkyl type phenol resin such as a phenol aralkyl resin, a biphenylene type phenol aralkyl resin, or a naphthol aralkyl resin synthesized from phenols and/or naphthols and dimethoxy-p-xylene or bis(methoxymethyl) biphenyl; a dicyclopentadiene type phenol resin such as a dicyclopentadiene type phenol novolac resin or a dicyclopentadiene type naphthol novolac resin synthesized from phenols and/or naphthols and dicyclopentadiene by copolymerization; a triphenylmethane type phenol resin; a terpene-modified phenol resin; a para-xylylene and/or meta-xylylene-modified phenol resin; a melamine-modified phenol resin; a cyclopentadiene-modified phenol resin; and a phenol resin obtained by copolymerization of two or more kinds thereof.

These phenol resins may be used singly or in combination of two or more kinds thereof with respect to the naphthalenediol aralkyl resin. As the content in a case in which another phenol resin is used together, the naphthalenediol aralkyl resin is preferably 50% by mass or more, and more preferably 80% by mass or more in total phenol resins in order to sufficiently obtain the effect of the naphthalenediol aralkyl resin.

The total amount of the (B) phenol resin containing a naphthalenediol aralkyl resin is preferably added with respect to the total amount of the (A) epoxy resin containing a trisphenolmethane type epoxy resin such that the hydroxyl

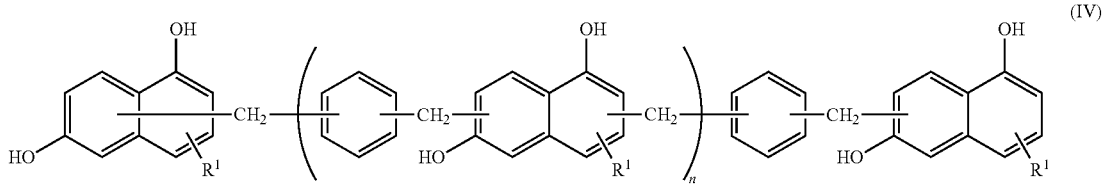

group of the (B) phenol resin and the epoxy group of the (A) epoxy resin become nearly the same equivalent.

Specifically, the ratio (the number of hydroxyl group in a curing agent/the number of epoxy group in an epoxy resin) of the number of hydroxyl group in the (B) phenol resin (curing agent) to the number of epoxy group in the (A) epoxy resin is not particularly limited, and is preferably set to the range of from 0.5 to 2, and more preferably set to the range of from 0.6 to 1.3 in order to suppress the unreacted portion of the respective functional groups to a small amount. The ratio is still more preferably set to the range of from 0.8 to 1.2 in order to obtain an epoxy resin composition for sealing, which is excellent in moldability.

[(C) Dihydroxynaphthalene Compound]

The epoxy resin compound of the present invention contains a compound represented by the following Formula (III), hereinafter, it is referred to as a dihydroxynaphthalene compound.

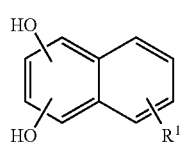

(III)

In Formula (III), $R^1$ represents a hydrogen atom, an alkyl group having from 1 to 6 carbon atoms, or an alkoxy group having 1 or 2 carbon atoms.

The dihydroxynaphthalene compound is a compound used as a raw material when the naphthalenediol aralkyl resin is synthesized. Fluidity of the epoxy resin composition can be improved by containing the dihydroxynaphthalene compound in the epoxy resin composition, and fluidity and heat resistance can be adjusted by adjusting the blending ratio with the naphthalenediol aralkyl resin. Meanwhile, the dihydroxynaphthalene compound has a rigid structure of a naphthalene ring and two hydroxyl groups bonded to the naphthalene ring in the same manner as a naphthalenediol aralkyl resin. For that reason, it is considered that the heat resistance of the resin composition can be maintained while improving the fluidity compared to other low molecular weight phenol compounds and the like.

Specific examples of the dihydroxynaphthalene compound include 1,5-dihydroxynaphthalene, 1,6-dihydroxynaphthalene, 1,7-dihydroxynaphthalene, 2,6-dihydroxynaphthalene, and 2,7-dihydroxynaphthalene. In particular, 1,6-dihydroxynaphthalene is preferably used in terms of fluidity as a resin composition.

The content ratio of the naphthalenediol aralkyl resin to the dihydroxynaphthalene compound is as follows. The content of the dihydroxynaphthalene compound is preferably from 10% by mass to 55% by mass, and more preferably from 20% by mass to 50% by mass with respect to the total amount of the naphthalenediol aralkyl resin and the dihydroxynaphthalene compound in terms of fluidity and heat resistance. Fluidity is improved by setting the content of the dihydroxynaphthalene compound to 10% by mass or more, and excellent heat resistance (high Tg) is easily obtained by setting the content to 55% by mass or less.

Here, the content of the dihydroxynaphthalene compound with respect to the total amount of the naphthalenediol aralkyl resin and the dihydroxynaphthalene compound can be calculated from the area integral ratio of GPC detected by a refractive index detector (RI).

The hydroxyl group equivalent when the naphthalenediol aralkyl resin represented by Formula (II) and the dihydroxynaphthalene compound represented by Formula (III) are summed is preferably from 70 to 140, more preferably from 80 to 135, and still more preferably from 90 to 130.

As a method of measuring the hydroxyl group equivalent, a general method can be adopted, and for example, the hydroxyl group equivalent can be measured by a method based on JIS K0070.

[(D) Antioxidant]

An antioxidant is preferably contained in the epoxy resin composition of the present invention if necessary in order to prevent the oxidation of resin. An antioxidant is an additive to prevent the oxidation of resin. An epoxy resin composition containing the above described epoxy resin and phenol resin is capable of reducing the decrease in elastic modulus at a high temperature, and further, the mass decrease of a cured product under high temperature exposure can be suppressed by containing an antioxidant in the resin composition of the above described epoxy resin and phenol resin.

Examples of the antioxidant include a phenolic antioxidant, a phosphite-based antioxidant, a sulfur-based antioxidant, and a hindered amine-based antioxidant. These antioxidants can be used together. In particular, a phenolic antioxidant is preferably contained. The thermo-oxidative degradation of resin can be effectively prevented by using a phenolic antioxidant. The thermo-oxidative degradation of resin can be further effectively suppressed by containing a phenolic antioxidant and further using other antioxidants such as a phosphite-based antioxidant, a sulfur-based antioxidant, and a hindered amine-based antioxidant together if necessary.

Examples of the phenolic antioxidant include 1,3,5-tris (3',5'-di-t-butyl-4'-hydroxybenzyl) isocyanurate, 1,1,3-tris (2-methyl-4-hydroxy-5-t-butylphenyl)butane, 3-(4'-hydroxy-3',5'-di-t-butylphenyl) propionate-n-octadecyl, 3-(4'-hydroxy-3',5'-di-t-butylphenyl) propionate-n-octadecyl, 3,9-bis-{2-[3-(3-t-butyl-4-hydroxy-5-methylphenyl) propionyloxy]-1,1-dimethylethyl}2,4,8,10-tetraoxaspiro [5.5]undecane, 2-t-butyl-4-methoxyphenol, 3-t-butyl-4-methoxyphenol, 2,6-di-t-butyl-4-ethylphenol, 2,2'-methylene-bis(4-methyl-6-t-butylphenol), 4,4'-thiobis-(3-methyl-6-t-butylphenol), 4,4'-butylidene-bis(3-methyl-6-t-butylphenol), 1,3,5-trimethyl-2,4,6-tris(3,5-di-t-butyl-4-hydroxybenzyl)benzene, and tetrakis-[methylene-3-(3',5'-di-t-butyl-4'-hydroxyphenyl)propionate]methane.

The phenolic antioxidant is preferably a phenolic antioxidant, in which each of two carbon atoms adjacent to a carbon atom bonded to a phenolic hydroxyl group has an organic group having one or more carbon atoms. Specific examples of the organic group preferably include methyl group, ethyl group, propyl group, butyl group, isopropyl group, and t-butyl group. More preferably, the phenolic antioxidant is preferably a phenolic antioxidant, in which each of two carbon atoms adjacent to a carbon atom bonded to a phenolic hydroxyl group has an organic group containing a tertiary carbon as a substituent. As the organic group containing a tertiary carbon, t-butyl group is specifically exemplified.

The phenolic antioxidant may be synthesized and/or prepared according to a common method, or a commercially available product may be purchased. Examples of the commercially available product of antioxidant include "YOSHINOX BB", "YOSHINOX BHT", and "YOSHINOX 425" (these are trade names and manufactured by API CORPORATION), "TTIC" and "TTAD" (these are trade names and manufactured by TORAY INDUSTRIES, INC.), "IRGANOX L107" (this is a trade name and manufactured by BASF Japan Ltd.), and "AO-20", "AO-30", "AO-40", "AO-50", "AO-50F", "AO-60", "AO-60G", "AO-70", "AO-80", and "AO-330" (these are trade names and manufactured by ADEKA CORPORATION). These may be used singly or in combination of two or more kinds thereof.

Among them, a compound represented by the following Formula (V) containing four structures, each structure having a t-butyl group at each ortho position on both sides of a phenolic hydroxyl group, is preferable. The effect of reliability improvement is more expected from a compound, in which a phenolic hydroxyl group is surrounded by a more bulky substituent and thus the steric hindrance thereof is high, and which contains such a structure more in number. As such a compound, "AO-60", which is a trade name and manufactured by ADEKA CORPORATION, is exemplified.

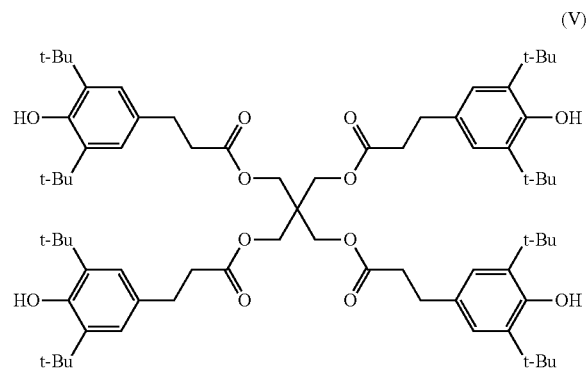 [SMILES: CC(C)(C)c1cc(CCC(=O)OCC(COC(=O)CCc2cc(C(C)(C)C)c(O)c(C(C)(C)C)c2)(COC(=O)CCc2cc(C(C)(C)C)c(O)c(C(C)(C)C)c2)COC(=O)CCc2cc(C(C)(C)C)c(O)c(C(C)(C)C)c2)cc(C(C)(C)C)c1O]

(V)

The content of the phenolic antioxidant in the epoxy resin composition of the present invention is not particularly limited as long as the inhibitory effect of mass decrease is achieved. However, since a glass transition temperature decreases in some cases if a large amount of antioxidant is blended, the antioxidant is preferably blended in total from 0.1 part by mass to 20 parts by mass, and more preferably blended in total from 1 part by mass to 10 parts by mass with respect to 100 parts by mass of the total epoxy resin in terms of glass transition temperature (heat resistance) of the epoxy resin composition. The inhibitory effect of mass decrease of a cured product is sufficiently achieved by setting the content of the phenolic antioxidant to 0.1 part by mass or more. In addition, the decrease in glass transition temperature (heat resistance) of a cured product is suppressed by setting the content of the phenolic antioxidant to 20 parts by mass or less.

Examples of the phosphite-based antioxidant include triphenyl phosphite, diphenylisodecyl phosphite, phenyldiisodecyl phosphite, 4,4'-butylidene-bis(3-methyl-6-t-butyl-phenylditridecyl) phosphite, cyclic neopentanetetrayl bis (nonylphenyl) phosphite, cyclic neopentanetetrayl bis (dinonylphenyl) phosphite, cyclic neopentanetetrayl tris (nonylphenyl) phosphite, cyclic neopentanetetrayl tris (dinonylphenyl) phosphite, 10-(2,5-dihydroxyphenyl)-10H-9-oxa-10-phosphaphenanthrene-10-oxide,2,2-methylene-bis (4,6-di-t-butylphenyl) octyl phosphite, diisodecyl pentaerythritol phosphite, and tris(2,4-di-t-butylphenyl) phosphite. These may be used singly or in combination of two or more kinds thereof.

Examples of the sulfur-based antioxidant include tetrakis [methylene-3-(dodecylthio) propionate]methane, dilauryl 3,3'-thiodipropionate, distearyl 3,3'-thiodipropionate, N-cyclohexyl thiophthalimide, and N-n-butyl benzene sulfonamide. These may be used singly or in combination of two or more kinds thereof.

Examples of the hindered amine-based antioxidant include bis(2,2,6,6-tetramethyl-4-piperidyl) sebacate, bis(1,2,2,6,6-pentamethyl-4-piperidyl) sebacate, 3-dodecyl-1-(2,2,6,6-tetramethyl-4-piperidyl) pyrrolidine-2,5-dione, N-methyl-3-dodecyl-1-(2,2,6,6-tetramethyl-4-piperidyl) pyrrolidine-2,5-dione, N-acetyl-3-dodecyl-1-(2,2,6,6-tetramethyl-4-piperidyl) pyrrolidine-2,5-dione, poly[{6-(1,1,3,3-tetramethylbutyl)imino-1,3,5-triazine-2,4-diyne}{(2,2,6,6-tetramethyl-4-piperidyl)imino}hexamethylene {(2,2,6,6-tetramethyl-4-piperidyl)imino}]. These may be used singly or in combination of two or more kinds thereof.

In addition, the above described antioxidants may be melted and blended with the epoxy resin and/or the phenol resin in advance, and then used. The antioxidant can be sufficiently dispersed in the resin composition by melting and blending the antioxidant with the epoxy resin and/or the phenol resin in advance.

[(E) Curing Accelerator]

The molding material of the present invention preferably contains (E) a curing accelerator in order to promote the curing reaction. As the (E) curing accelerator used in the present invention, a curing accelerator generally used for an epoxy resin molding material for sealing is exemplified, and there is no particular limitation.

Examples of the curing accelerator include a cycloamidine compound such as 1,8-diazabicyclo[5.4.0]undecene-7, 1,5-diazabicyclo[4.3.0]nonene-5, and 5,6-dibutylamino-1,8-diazabicyclo[5.4.0]undecene-7, and a compound having intramolecular polarization, which is obtained by adding maleic anhydride, a quinone compound such as 1,4-benzoquinone, 2,5-toluquinone, 1,4-naphthoquinone, 2,3-dimethyl benzoquinone, 2,6-dimethyl benzoquinone, 2,3-dimethoxy-5-methyl-1,4-benzoquinone, 2,3-dimethoxy-1,4-benzoquinone, and phenyl-1,4-benzoquinone, and a compound having a π-bond such as diazophenylmethane and a phenol resin to these cycloamidine compounds; tertiary amines such as benzyldimethylamine, triethanolamine, dimethylaminoethanol, and tris(dimethylaminomethyl)phenol, and derivatives thereof; imidazoles such as 2-methylimidazole, 2-phenylimidazole, 2-phenyl-4-methylimidazole, and 2-heptadecylimidazole, and derivatives thereof; an organic phosphine such as tributylphosphine, methyldiphenylphosphine, triphenylphosphine, tris(4-methylphenyl) phosphine, tris(4-butylphenyl)phosphine, diphenylphosphine, and phenylphosphine, and a phosphorus compound having intramolecular polarization, which is obtained by adding maleic anhydride, the above described quinone compound, and a compound having a π-bond such as diazophenylmethane and a phenol resin to these phosphines; and a tetraphenylborate such as tetraphenylphosphonium tetraphenylborate, triphenylphosphine tetraphenylborate, 2-ethyl-4-methylimidazole tetraphenylborate, and N-methylmorpholine tetraphenylborate, and a derivative thereof. These may be used singly or in combination of two or more kinds thereof.

Among them, an adduct of a tertiary phosphine and a quinone compound is preferable, and an adduct of triphenylphosphine and benzoquinone is more preferable in terms of curing property and fluidity. An adduct of a cycloamidine compound and a phenol resin is preferable, and a novolac type phenol resin salt of diazabicycloundecene is more preferable in terms of storage stability.

The total blending amount of the adduct of a tertiary phosphine and a quinone and/or the adduct of a cycloamidine compound and a phenol resin as a curing accelerator is preferably 60% by mass or more, and more preferably 80% by mass or more in the total amount of curing accelerator.

The tertiary phosphine used for the adduct of a tertiary phosphine and a quinone compound is not particularly limited, and examples thereof include tributylphosphine and a tertiary phosphine having an aryl group, such as dibutylphenylphosphine, butyldiphenylphosphine, ethyldiphenylphosphine, triphenylphosphine, tris(4-methylphenyl)phosphine, tris(4-ethylphenyl)phosphine, tris(4-propylphenyl)phosphine, tris(4-butylphenyl)phosphine, tris(isopropylphenyl)phosphine, tris(t-butylphenyl)phosphine, tris(2,4-dimethylphenyl)phosphine, tris(2,6-dimethylphenyl)phosphine, tris(2,4,6-trimethylphenyl)phosphine, tris(2,6-dimethyl-4-ethoxyphenyl)phosphine, tris(4-methoxyphenyl)phosphine, and tris(4-ethoxyphenyl)phosphine. Triphenylphosphine is preferable in terms of moldability.

In addition, the quinone compound used for the adduct of a tertiary phosphine and a quinone compound is not particularly limited, and examples thereof include o-benzoquinone, p-benzoquinone, diphenoquinone, 1,4-naphthoquinone, and anthraquinone. p-benzoquinone is preferable in terms of moisture resistance or storage stability.

Specific examples of the curing accelerator include a cycloamidine compound, which is a diazabicycloalkene, such as 1,5-diazabicyclo[4.3.0]non-5-ene, and 1,8-diazabicyclo[5.4.0]undec-7-en; a derivative of cycloamidine compound such as a phenol novolac salt of cycloamidine compound; a compound having intramolecular polarization, which is obtained by adding maleic anhydride, a quinone compound such as 1,4-benzoquinone, 2,5-toluquinone, 1,4-naphthoquinone, 2,3-dimethyl benzoquinone, 2,6-dimethyl benzoquinone, 2,3-dimethoxy-5-methyl-1,4-benzoquinone, 2,3-dimethoxy-1,4-benzoquinone, and phenyl-1,4-benzoquinone, and a compound having a π-bond such as diazophenylmethane and a phenol resin to a cycloamidine compound or a derivative thereof; a tertiary amine compound such as benzyldimethylamine, triethanolamine, dimethylaminoethanol, and tris(dimethylaminomethyl)phenol, and a derivative thereof; a imidazole compound such as 2-methylimidazole, 2-phenylimidazole, and 2-phenyl-4-methylimidazole, and a derivative thereof; an organic phosphine compound such as tributylphosphine, methyldiphenylphosphine, triphenylphosphine, tris(4-methylphenyl)phosphine, tris(4-butylphenyl)phosphine, diphenylphosphine, and phenylphosphine, and a phosphorus compound having intramolecular polarization, which is obtained by adding maleic anhydride, the above described quinone compound, and a compound having a π-bond such as diazophenylmethane and a phenol resin to these organic phosphine compounds; and a tetraphenylborate such as tetraphenylphosphonium tetraphenylborate, triphenylphosphine tetraphenylborate, 2-ethyl-4-methylimidazole tetraphenylborate, and N-methylmorpholine tetraphenylborate, and a derivative thereof.

These compounds may be used singly or in combination of two or more kinds thereof. Among them, an adduct of an organic phosphine and a quinone compound is suitable in terms of fluidity and moisture resistance.

The content of the (E) curing accelerator in the epoxy resin composition according to the present invention is not particularly limited as long as the effect of curing acceleration is achieved. The (E) curing accelerator is preferably blended in total at the proportion of from 0.1 part by mass to 10 parts by mass, and more preferably blended in total at the proportion of from 1 part by mass to 7 parts by mass with respect to 100 parts by mass of the total (A) epoxy resin in terms of improvement in fluidity and curing property at the time of moisture absorption of the resin composition. The curing of resin composition easily proceeds in a short time by setting the content of the (E) curing accelerator to 0.1 part by mass or more, and an appropriate curing speed is obtained and thus a favorable molded product is easily obtained by setting the content of the (E) curing accelerator to 10 parts by mass or less.

[(F) Inorganic Filler]

An inorganic filler is preferably contained in the epoxy resin composition of the present invention if necessary. The inorganic filler may be blended for the purpose of improving the linear expansion coefficient, thermal conductivity, elastic modulus, or the like of a cured product of epoxy resin composition. Specific examples of the inorganic filler include a fine powder such as fused silica, crystalline silica, glass, alumina, calcium carbonate, zirconium silicate, calcium silicate, silicon nitride, aluminum nitride, boron nitride, beryllia, zirconia, zircon, forsterite, steatite, spinel, mullite, titania, talc, clay, and mica, and a spheroidized bead thereof.

Examples of the inorganic filler exhibiting flame retardant effect include aluminum hydroxide, magnesium hydroxide, a composite metal hydroxide such as a composite hydroxide of magnesium and zinc, zinc borate, and zinc molybdate.

Among these inorganic fillers, fused silica is preferable in terms of the reduction in linear expansion coefficient, and alumina is preferable in terms of high thermal conductivity. These inorganic fillers may be used singly or in combination of two or more kinds thereof.

The content of the inorganic filler is not particularly limited as long as the effect of the present invention is obtained, and is preferably 50% by mass or more, more preferably from 60% by mass to 95% by mass in terms of flame retardance, and still more preferably from 70% by mass to 90% by mass in the epoxy resin composition. The property of cured product, such as linear expansion coefficient, thermal conductivity, and elastic modulus is improved by setting the content of the inorganic filler to 50% by mass or more. The increase in viscosity of the epoxy resin composition is reduced, sufficient fluidity is easily obtained, and thus moldability is improved by setting the content of the inorganic filler to 95% by mass or less.

The average particle size (D50) of the inorganic filler is preferably from 0.1 μm to 50 μm, and more preferably from 10 μm to 30 μm. The increase in viscosity of the epoxy resin composition is suppressed by setting the average particle size to 0.1 μm or more, and the separation between the resin constituent and the inorganic filler can be reduced by setting the average particle size to 50 μm or less. Hence, it is prevented that a cured product is ununiform, the property of cured product varies, and the filling property to a narrow opening decreases by setting the average particle size within the above described range.

A volume average particle size (D50) is a particle size at which the cumulation becomes 50% by volume when a volume cumulative distribution curve is drawn from the smaller size side in a particle size distribution. The measurement can be performed by dispersing a sample in purified water containing a surfactant, and using a laser diffraction particle size distribution measuring apparatus (for example, SALD-3000J manufactured by Shimadzu Corporation).

The particle shape of an inorganic filler is preferably a spherical shape rather than a square shape, and the particle distribution of the inorganic filler is preferably distributed in a wide range, in terms of fluidity. For example, in a case in which the inorganic filler is blended at 75% by volume or more with respect to the epoxy resin composition, it is preferable that 70% by mass or more of the inorganic filler is a spherical particle and the particle distribution of the inorganic filler is distributed in a wide range of from 0.1 μm to 80 μm. Since such a inorganic filler easily takes the closest packing structure, the increase in viscosity of the epoxy resin composition is small in degree even the content of the inorganic filler is increased, and thus an epoxy resin composition excellent in fluidity can be obtained.

The specific surface area of the inorganic filler is preferably from 0.1 m$^2$/g to 10 m$^2$/g, and more preferably from 0.5 m$^2$/g to 6.0 m$^2$/g in terms of flame retardance and fluidity.

[Various Additives]

The epoxy resin composition of the present invention can contain various additives to be exemplified below, such as a coupling agent, an ion exchanger, a mold releasing agent, a stress relaxing agent, a flame retardant, and a colorant if necessary in addition to the epoxy resin, the phenol resin, the antioxidant, the curing accelerator, and the inorganic filler, which are described above. Provided that the additive is not limited to the additives to be described below, and various additives well-known in the related technical field may be added to the epoxy resin composition of the present invention if necessary.

(Coupling Agent)

A well-known coupling agent such as various silane compounds such as an epoxysilane, a mercaptosilane, an aminosilane, an alkylsilane, a ureidosilane, and a vinylsilane, a titanium-based compound, an aluminum chelate, and an aluminum/zirconium-based compound is preferably added to the epoxy resin composition of the present invention if necessary in order to increase the adhesion between the resin constituent and the inorganic filler.

The content of the coupling agent is preferably from 0.05% by mass to 5% by mass, and more preferably from 0.1% by mass to 2.5% by mass with respect to the inorganic filler. The adhesion with a frame can be improved by setting the content to 0.05% by mass or more, and the moldability of a package is improved by setting the content to 5% by mass or less. These coupling agents may be used singly or in combination of two or more kinds thereof.

(Ion Exchanger)

The epoxy resin composition of the present invention preferably contains an anion exchanger if necessary. In particular, in a case in which the epoxy resin composition is used as a molding material for sealing, an anion exchanger is preferably contained in terms of improving the moisture resistance and high temperature exposure property of an electronic component device equipped with an element to be sealed.

The anion exchanger is not particularly limited, and a conventionally known anion exchanger can be used. Examples of the anion exchanger include a hydrotalcite or a hydrous oxide of an atom selected from magnesium, aluminum, titanium, zirconium, or bismuth. These may be used singly or in combination of two or more kinds thereof.

(Mold Releasing Agent)

A mold releasing agent is preferably blended to the epoxy resin composition of the present invention in order to impart favorable mold release property with a mold at the time of molding. The mold releasing agent used in the present invention is not particularly limited, and a conventionally known mold releasing agent can be used.

Examples of the mold releasing agent include carnauba wax, a higher fatty acid such as montanic acid and stearic acid, a metal salt of higher fatty acid, an ester wax such as an ester of montanic acid, and a polyolefin wax such as an oxidized polyethylene and a non-oxidized polyethylene. These may be used singly or in combination of two or more kinds thereof. Among these, an oxidized type or non-oxidized type polyolefin wax is preferable.

The content of the mold releasing agent is preferably from 0.01% by mass to 10% by mass, and more preferably from 0.1% by mass to 5% by mass with respect to the epoxy resin. The effect of mold release property is easily obtained by setting the content of the mold releasing agent to 0.01% by mass or more, and adhesion is improved by setting the content of the mold releasing agent to 10% by mass or less.

(Stress Relaxing Agent)

A stress relaxing agent such as a silicone oil and a silicone rubber powder is preferably blended to the epoxy resin composition of the present invention if necessary. The curvature deformation amount of package and package crack can be reduced by blending the stress relaxing agent.

The usable stress relaxing agent is not particularly limited as long as the stress relaxing agent is a publicly known flexing agent (stress relaxing agent), which is generally used. Examples of the flexing agent, which is generally used, include a thermoplastic elastomer such as a silicone-based thermoplastic elastomer, a styrene-based thermoplastic elastomer, an olefin-based thermoplastic elastomer, a urethane-based thermoplastic elastomer, a polyester-based thermoplastic elastomer, a polyether-based thermoplastic elastomer, a polyamide-based thermoplastic elastomer, and a polybutadiene-based thermoplastic elastomer; a rubber powder such as NR (natural rubber), NBR (acrylonitrile-butadiene rubber), an acrylic rubber, a urethane rubber, and a silicone powder; and a rubber powder having a core shell structure such as a methyl methacrylate-styrene-butadiene copolymer (MBS), a methyl methacrylate-silicone copolymer, and a methyl methacrylate-butyl acrylate copolymer. These may be used singly or in combination of two or more kinds of thereof.

(Flame Retardant)

A flame retardant is preferably blended to the epoxy resin composition of the present invention if necessary in order to impart flame retardance. The flame retardant used in the present invention is not particularly limited, and examples thereof include a well-known organic or inorganic compound containing a halogen atom, an antimony atom, a nitrogen atom or a phosphorus atom, and a metal hydroxide. These may be used singly or in combination of two or more kinds thereof.

(Colorant)

A publicly known colorant such as carbon black, an organic dye, an organic pigment, titanium oxide, red lead, and red iron oxide can be blended to the epoxy resin composition of the present invention.

<Preparation of Epoxy Resin Composition>

The epoxy resin composition of the present invention can be prepared using any technique as long as various raw materials can be uniformly dispersed and mixed. As a general preparation method, a method, in which a raw material of a predetermined content is sufficiently mixed by a mixer or the like, and then the resultant is mixed or melted and kneaded by a mixing roll, an extruder, a kneader, or a planetary mixer, thereafter, the resultant is cooled, defoamed if necessary, and crushed, or the like can be exemplified. In addition, the epoxy resin composition may be formed into a tablet with a dimension and mass conforming to the molding condition if necessary.

As a method of sealing an electronic component device such as a semiconductor device using the epoxy resin composition of the present invention, a low pressure transfer molding method is the most general, but an injection molding method, a compression molding method, a dispensing method, a casting method, a printing method, or the like may be used.

<Electronic Component Device>

The electronic component device of the present invention is equipped with an element sealed by the above described epoxy resin composition of the present invention. Examples of the electronic component device include an electronic component device, in which an active element such as a semiconductor chip, a transistor, a diode, or a thyristor, and/or a passive element such as a capacitor, a resistor or a coil are mounted on a supporting member such as a lead frame, a pre-wired tape carrier, a circuit board, a glass, or a silicon wafer, and then these are sealed by the epoxy resin composition of the present invention.

More specific examples of the electronic component device include a general resin sealing type IC such as a DIP (Dual Inline Package), a PLCC (Plastic Leaded Chip Carrier), a QFP (Quad Flat Package), a SOP (Small Outline Package), a SOJ (Small Outline J-lead package), a TSOP (Thin Small Outline Package), or a TQFP (Thin Quad Flat Package), which is obtained by fixing a semiconductor element on a lead frame, connecting a terminal portion and a lead portion of the element such as a bonding pad to each other by wire bonding or a bump, and sealing the element by transfer molding or the like using the epoxy resin composition of the present invention; a TCP (Tape Carrier Package) obtained by sealing a semiconductor chip connected to a tape carrier by a bump using the epoxy resin composition of the present invention; a COB (Chip On Board) module, a hybrid IC, or a multichip module obtained by sealing an active element such as a semiconductor chip, a transistor, a diode, or a thyristor, and/or a passive element such as a capacitor, a resistor or a coil connected to wiring formed on a circuit board or a glass by wire bonding, flip chip bonding, or solder with the epoxy resin composition of the present invention; and a BGA (Ball Grid Array) or a CSP (Chip Size Package) obtained by mounting an element on the front surface of an organic substrate having a terminal for circuit board connection formed on the rare surface, connecting the element and the wiring formed on the organic substrate to each other by a bump or wire bonding, and sealing the element with the epoxy resin composition of the present invention.

The epoxy resin composition of the present invention exhibits a high glass transition temperature in a case in which the epoxy resin composition is formed into a cured product, and the decrease in elastic modulus and mass at a high temperature is small in degree, and thus can be suitably used in an application requiring heat resistance and high temperature performance guarantee. Specific applications include a semiconductor package operating even at a high temperature, such as a power module package, an in-vehicle application package, SiC, and GaN. In addition, the epoxy resin composition of the present invention can be effectively used for a printed circuit board as well.

The disclosure of Japanese Patent Application No. 2011-215338 is incorporated by reference herein in their entireties.

All the literature, patent applications, and technical standards cited herein are also herein incorporated to the same extent as provided for specifically and severally with respect to an individual literature, patent application, and technical standard to the effect that the same should be so incorporated by reference.

EXAMPLES

Hereinafter, the present invention will be more specifically described with reference to Examples, but the scope of the present invention is not limited to these Examples. Meanwhile, the term "%" means "% by mass" unless otherwise stated.

<Arrangement of Each Constituent of Epoxy Resin Composition>

(A) Epoxy Resin

Epoxy resin 1: trisphenolmethane type epoxy resin (the epoxy resin of Formula (I), the content of the compound of Formula (I-1) is 46%, n represents an integer from 0 to 10, epoxy equivalent: 170, Trade name: 1032H60 manufactured by Mitsubishi Chemical Corporation (formerly Japan Epoxy Resins Co., Ltd.))

Epoxy resin 2: naphthalenediol aralkyl type epoxy resin (epoxy equivalent: 164, Trade name: ESN-355 manufactured by Nippon Steel Chemical Co., Ltd. (formerly Toto Kasei, Co.))

Epoxy resin 3: o-cresol novolac type epoxy resin (epoxy equivalent: 195, Trade name: ESCN-190-2 manufactured by Sumitomo Chemical Co., Ltd.)

Epoxy resin 4: biphenyl type epoxy resin (epoxy equivalent: 196, Trade name: YX-4000H manufactured by Mitsubishi Chemical Corporation (formerly Japan Epoxy Resins Co., Ltd.))

Epoxy resin 5: biphenylene type epoxy resin (epoxy equivalent: 273, Trade name: NC-3000 manufactured by NIPPON KAYAKU Co., Ltd.)

(B) Phenol Resin

Phenol resin 1: the phenol resin of Formula (II), which contains 1,6-dihydroxynaphthalene at 30% (n represents an integer from 0 to 10, $R^1$ represents a hydrogen atom, hydroxyl group equivalent: 110, Trade name: SN-395 and lot number: 71101 manufactured by Nippon Steel Chemical Co., Ltd. (formerly Toto Kasei, Co.))

Phenol resin 2: the phenol resin of Formula (II), which contains 1,6-dihydroxynaphthalene at 47% (n represents an integer from 0 to 10, $R^1$ represents a hydrogen atom, hydroxyl group equivalent: 100, Trade name: SN-375 and lot number: P-20033 manufactured by Nippon Steel Chemical Co., Ltd. (formerly Toto Kasei, Co.))

Phenol resin 3: the phenol resin of Formula (II), which contains 1,6-dihydroxynaphthalene at 60% (n represents an integer from 0 to 10, $R^1$ represents a hydrogen atom, hydroxyl group equivalent: 99, Trade name: SN-375 and lot number: P-090810 manufactured by Nippon Steel Chemical Co., Ltd. (formerly Toto Kasei, Co.))

Phenol resin 4: trisphenolmethane type phenol resin (hydroxyl group equivalent: 103, Trade name: MEH-7500 manufactured by MEIWA PLASTIC INDUSTRIES, LTD.)

Phenol resin 5: phenol novolac type phenol resin (hydroxyl group equivalent: 106, Trade name: HP-850N manufactured by Hitachi Chemical Co., Ltd.)

Phenol resin 6: biphenylenedimethylene type phenol resin (hydroxyl group equivalent: 199, Trade name: HE-200C-10 manufactured by AIR WATER INC (formerly Air Water Chemical Co., Ltd.))

The content of 1,6-dihydroxynaphthalene contained in the phenol resin 1, the phenol resin 2, and the phenol resin 3 was measured using a gel permeation chromatography (GPC). The conditions of the GPC were as follows.

[Condition of GPC]

Pump: L6200 Pump (manufactured by Hitachi, Ltd.)

Detector: refractive index detector L3300 RI Monitor (manufactured by Hitachi, Ltd.)

Column: TSK gel-G5000HXL and TSK gel-G2000HXL (total 2 columns) (both of them are manufactured by TOSOH CORPORATION) are used by connecting in series.

Eluent: tetrahydrofuran

Flow rate: 1 ml/min

Temperature of column oven: 30° C.

[Content of Dihydroxynaphthalene Compound]

Figure 2:
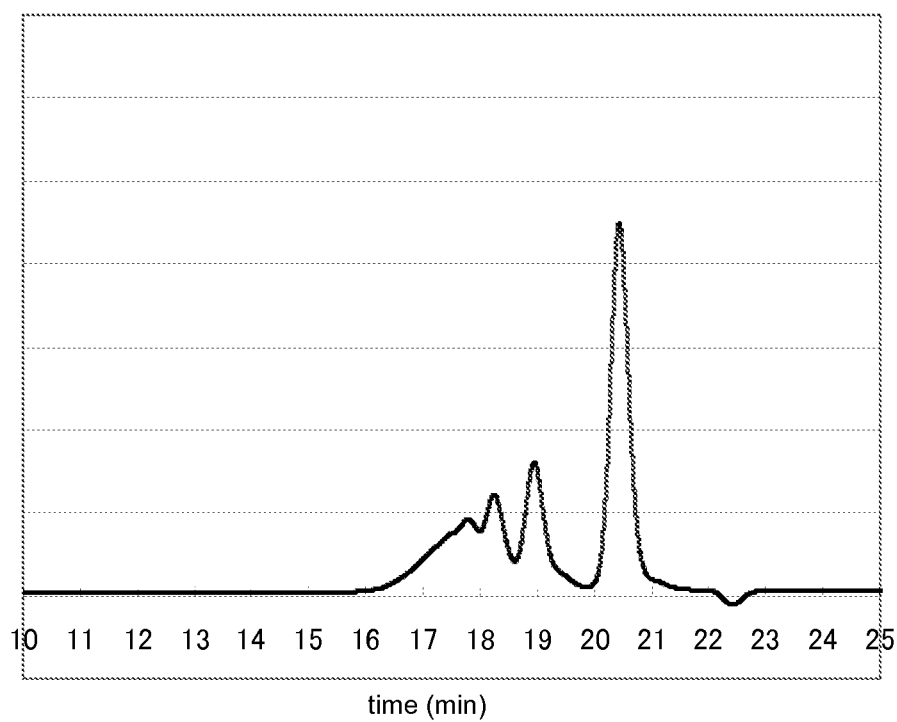
FIG. 2 is a GPC chart for phenol resin 2.
Figure 3:
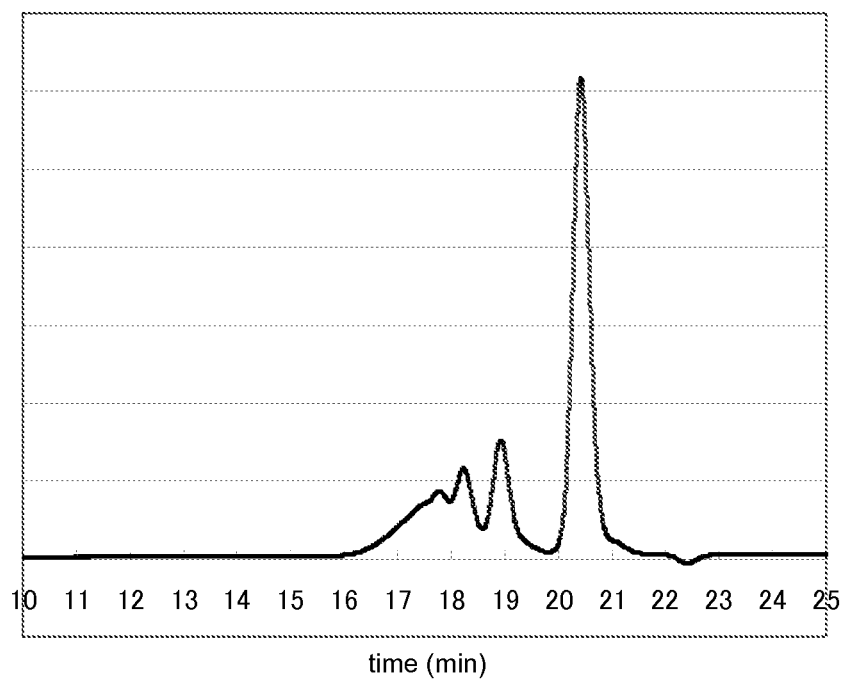
FIG. 3 is a GPC chart for phenol resin 3.

GPC charts for the phenol resin 1, the phenol resin 2, and the phenol resin 3 are shown in FIGS. 1, 2, and 3. The peaks for 1,6-dihydroxynaphthalene in FIGS. 1 to 3 are the peaks at about 20.5 minutes, and the peaks at from 16 minutes to 20 minutes indicate the mixture of 1,6-naphthalenediol aralkyl resin. The content of the (C) dihydroxynaphthalene compound was calculated from the percentage of spectrum area obtained from this. The content (C)/[(B)+(C)] of the constituent (C) with respect to the total amount of the constituent (B) and the constituent (C) was calculated by taking the constituent of dihydroxynaphthalene compound in the phenol resin as (C) and the constituents other than the constituent (C) as (B), and the content thus obtained was taken as the content of the dihydroxynaphthalene compound.

(D) Antioxidant

Hindered phenolic antioxidant (Trade name: AO-60 manufactured by ADEKA CORPORATION)

(E) Curing Accelerator

Product of addition reaction of triphenylphosphine and 1,4-benzoquinone (F) Inorganic Filler Spherical fused silica having an average particle size (D50) of 17.5 μm and a specific surface area of 3.8 $m^2/g$ (Other Additives)

Coupling agent: epoxysilane (γ-glycidoxypropyltrimethoxysilane) Colorant: carbon black (Trade name: MA-100 manufactured by Mitsubishi Chemical Corporation)

Mold releasing agent: carnauba wax (manufactured by CERARICA NODA Co., Ltd.)

<Preparation of Epoxy Resin Composition>

Each of the constituents described above was blended at the part by mass shown in the following Tables 1 and 2, and then roll kneading was performed under the condition of a kneading temperature of 80° C. and a kneading time of 15 minutes, thereby obtaining each of the epoxy resin compositions of Examples 1 to 9 and Comparative Examples 1 to 8.

<Molding of Epoxy Resin Composition>

Next, each of the epoxy resin compositions obtained according to Examples 1 to 9 and Comparative Examples 1 to 8 was evaluated by each of the tests to be described below, and the results thereof are shown in Tables 1 and 2.

Meanwhile, the molding of the epoxy resin composition was performed using a transfer molding machine and under the condition of a mold temperature of 180° C., a molding pressure of 6.9 MPa, and a heating time for curing of 90 seconds.

<Evaluation>

(Glass Transition Temperature)

The molding of the epoxy resin composition was performed using a mold, by which a specimen having a length of 80 mm, a width of 10 mm, and a thickness of 3 mm is molded, under the above described molding condition, and after cure was further performed for 6 hours at 250° C. Subsequently, the specimen was cut into a piece having a length of 50 mm and a width of 5 mm using a diamond cutter, and then the measurement was performed using a viscoelasticity measuring apparatus RSA3 (manufactured by TA Instruments.) at three-point bending mode, and under the condition of a temperature rising speed of 5° C./min and a frequency of 6.28 rad/s. The peak value for tan δ was taken as the glass transition temperature. The measurement results of glass transition temperature are shown in Tables 1 and 2.

(Fluidity)

The molding of an epoxy resin composition for sealing was performed by a transfer molding machine using a mold for spiral flow measurement based on EMMI-1-66 and under the condition of a mold temperature of 180° C., a molding pressure of 6.9 MPa, and a heating time for curing of 90 seconds, and then the flow distance (cm) was obtained. The measurement results of fluidity are shown in Tables 1 and 2.

(Elastic Modulus Retention)

A specimen same as the specimen for the measurement method of glass transition temperature was prepared, and then the elastic modulus retention was measured with respect to this specimen using a viscoelasticity measuring apparatus RSA3 (manufactured by TA Instruments.) at three-point bending mode and under the condition of a temperature rising speed of 5° C./min and a frequency of 6.28 rad/s. Thereafter, the elastic modulus retention was calculated by the following Mathematical Formula (1) from the elastic modulus ($A^1$) at 60° C. and the elastic modulus ($B^1$) at 250° C. The evaluation results of elastic modulus retention are shown in Tables 1 and 2.

$$\text{Elastic modulus retention}(\%) = B^1/A^1 \times 100 \quad \text{Mathematical Formula (1)}$$

(Mass Retention)

The molding of an epoxy resin composition was performed using a mold, by which a circular plate having a diameter of 50 mm and a thickness of 3 mm is molded, and under the above described molding condition, and then after cure was performed for 6 hours at 250° C. Thereafter, a mass ($A^2$) of the resultant was measured. Next, the circular plate thus obtained was stored in a high temperature oven of 250° C. and taken out after a predetermined time (1008 h), and a mass ($B^2$) thereof was measured. The mass retention was calculated by the following Mathematical Formula (2) by subtracting the mass of inorganic filler from the total mass of epoxy resin composition, and then converting into the resin content using the mass ($A^2$) and the mass ($B^2$). The evaluation results of mass retention are shown in Tables 1 and 2.

$$\text{Mass retention}(\%) = (B^2 \text{ mass of inorganic filler in epoxy resin composition})/(A^2 \text{ mass of inorganic filler in epoxy resin composition}) \times 100 \quad \text{Mathematical Formula (2)}$$

TABLE 1

| | Items | Examples | | | | | | | | |
|---|---|---|---|---|---|---|---|---|---|---|
| | | 1 | 2 | 3 | 4 | 5 | 6 | 7 | 8 | 9 |
| Epoxy Resin | 1 | 100 | 100 | 80 | 100 | 100 | 100 | 80 | 100 | 100 |
| | 2 | | | | | | | | | |
| | 3 | | | 20 | | | | 20 | | |
| | 4 | | | | | | | | | |
| | 5 | | | | | | | | | |
| Phenol Resin | 1 | 65 | | 63 | 52 | 65 | | 63 | 52 | |
| | 2 | | 59 | | | | 59 | | | |
| | 3 | | | | | | | | | 58 |
| | 4 | | | | 13 | | | | 13 | |
| | 5 | | | | | | | | | |
| | 6 | | | | | | | | | |
| Antioxidant | Part by mass | | | | | 5 | 5 | 5 | 5 | |
| Curing Accelerator | Part by mass | 2 | 2 | 2 | 2 | 2 | 2 | 2 | 2 | 2 |
| Coupling Agent | Part by mass | 11 | 11 | 11 | 11 | 11 | 11 | 11 | 11 | 11 |
| Mold Releasing Agent | Part by mass | 1 | 1 | 1 | 1 | 1 | 1 | 1 | 1 | 1 |
| Colorant | Part by mass | 2.6 | 2.6 | 2.6 | 2.6 | 2.6 | 2.6 | 2.6 | 2.6 | 2.6 |
| Inorganic Filler | Part by mass | 1023 | 990 | 1013 | 1018 | 1051 | 1018 | 1042 | 1046 | 986 |
| | % by mass in Resin Composition | 85 | 85 | 85 | 85 | 85 | 85 | 85 | 85 | 85 |
| Evaluation Items | Glass Transition Temperature (° C.) | 286 | 254 | 253 | 260 | 276 | 246 | 243 | 251 | 226 |
| | Fluidity | 78 | 105 | 90 | 92 | 82 | 110 | 93 | 85 | 120 |
| | Elastic modulus Retention (%) | 57 | 45 | 50 | 54 | 56 | 45 | 49 | 54 | 18 |
| | Weight Retention (%) | 88 | 88 | 87 | 88 | 95 | 93 | 92 | 92 | 88 |

TABLE 2

| | Items | Comparative Examples | | | | | | | |
|---|---|---|---|---|---|---|---|---|---|
| | | 1 | 2 | 3 | 4 | 5 | 6 | 7 | 8 |
| Epoxy Resin | 1 | 100 | 100 | | | | 100 | | |
| | 2 | | | 100 | 100 | | | | |
| | 3 | | | | | 100 | | | |
| | 4 | | | | | | | 100 | |
| | 5 | | | | | | | | 100 |
| Phenol Resin | 1 | | | | | | | | |
| | 2 | | | | | 61 | | 51 | 37 |
| | 3 | | | | | | | | |
| | 4 | 61 | | 63 | | | | | |
| | 5 | | | | | | 54 | 62 | |
| | 6 | | 117 | | | | | | |
| Antioxidant | Part by mass | | | | | | | | |
| Curing Accelerator | Part by mass | 2 | 2 | 2 | 2 | 2 | 2 | 2 | 2 |
| Coupling Agent | Part by mass | 11 | 11 | 11 | 11 | 11 | 11 | 11 | 11 |
| Mold Releasing Agent | Part by mass | 1 | 1 | 1 | 1 | 1 | 1 | 1 | 1 |
| Colorant | Part by mass | 2.6 | 2.6 | 2.6 | 2.6 | 2.6 | 2.6 | 2.6 | 2.6 |
| Inorganic Filler | Part by mass | 1000 | 1318 | 1012 | 1002 | 964 | 1009 | 946 | 864 |
| | % by mass in Resin Composition | 85 | 85 | 85 | 85 | 85 | 85 | 85 | 85 |
| Evaluation Items | Glass Transition Temperature (° C.) | 209 | 160 | 208 | 229 | 168 | 183 | 124 | 132 |
| | Fluidity | 115 | 138 | 107 | 54 | 116 | 107 | 168 | 165 |
| | Elastic Modulus Retention (%) | 16 | 8 | 15 | 19 | 12 | 11 | 8 | 8 |
| | Weight Retention (%) | 88 | 92 | 86 | 78 | 72 | 85 | 93 | 93 |

As can be seen from Tables 1 and 2, Examples 1 to 9 using the epoxy resin composition of the present invention exhibit a high glass transition temperature, and exhibit excellent reliability as mass decrease is small in degree (weight retention is high) even after storing under a high temperature environment of 250° C. when compared to Comparative Examples 1 to 8. From the result above, it has been found out that the combination of the trisphenolmethane type epoxy resin and the naphthalenediol aralkyl resin prescribed in the present invention is important. In addition, it has been found out that the epoxy resin composition of the present invention can provide a semiconductor device suitable for a use under a high temperature environment when formed as a cured product.

Since a trisphenolmethane type phenol resin is used for Comparative Example 3, The glass transition temperature thereof is not elevated even when a naphthalenediol aralkyl type epoxy resin is used as an epoxy resin. The reason for this is considered as follows. Steric hindrance occurs when a part of the trisphenolmethane type phenol resin reacts with the epoxy resin, and thus the reaction of an adjacent phenolic hydroxyl group with the epoxy resin is inhibited. As a result, crosslink density does not increase, and thus glass transition temperature is not elevated.

On the other hand, it has been found out that the Examples 5 to 8, in which an antioxidant is added, exhibit less decrease in weight after storing under a high temperature environment (250° C.). In addition, it has been found out that the Examples 1 to 8, in which the phenol resins 1 and 2 having the content of the dihydroxynaphthalene compound with respect to the total amount of the naphthalenediol aralkyl resin and the dihydroxynaphthalene compound in the range of from 10% by mass to 55% by mass are used, exhibit superior glass transition temperature and elastic modulus retention compared to Example 9, in which the phenol resin 3 containing the dihydroxynaphthalene compound at more than 55% by mass is used.

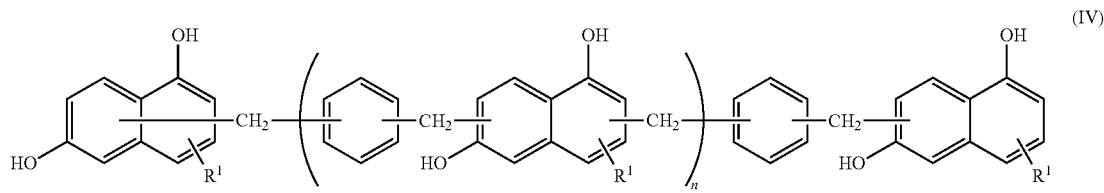

The invention claimed is:

1. An epoxy resin composition, consisting of:
an epoxy resin component (A) consisting of:
(1) a first compound represented by the following Formula (I), or
(2) an epoxy resin component consisting of:
at least 80% by mass, based on a total amount of the epoxy resin, of the first compound represented by the following Formula (I);
and a second epoxy compound having at least two epoxy groups per molecule, the second epoxy compound including a cresol novolac epoxy resin as the epoxy resin component (A);
(B) a phenol resin including a compound represented by the following Formula (II);
(C) a dihydroxynaphthalene compound including a compound represented by the following Formula (III); and
optionally, one or more of an antioxidant, a curing accelerator, an inorganic filler, a coupling agent, an ion exchanger, a mold releasing agent, a stress relaxing agent, a flame retardant, and a colorant;

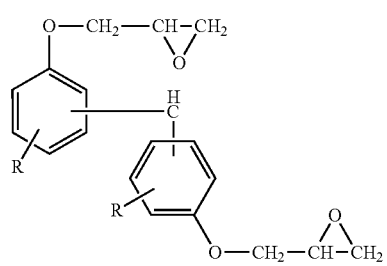

(I)

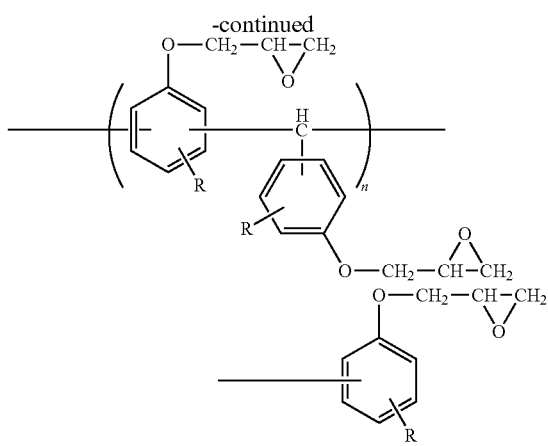

wherein, in the Formula (I), R represents a hydrogen atom, and n represents an integer from 0 to 10;

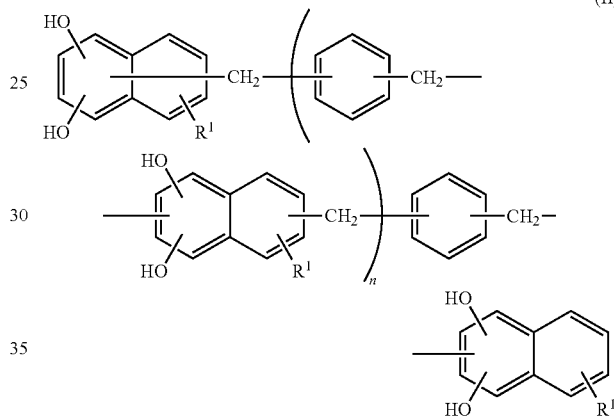

(II)

wherein, in the Formula (II), $R^1$ represents a hydrogen atom, an alkyl group having from 1 to 6 carbon atoms, or an alkoxy group having 1 or 2 carbon atoms, and each $R^1$ may be the same as or different from another $R^1$, and n represents an integer from 0 to 10;

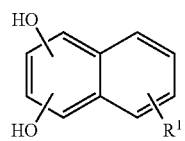

(III)

wherein, in the Formula (III), $R^1$ represents a hydrogen atom, an alkyl group having from 1 to 6 carbon atoms, or an alkoxy group having 1 or 2 carbon atoms;
wherein a content of a total amount of the compound represented by the Formula (III) with respect to a total amount of the compound represented by the Formula (II) and the compound represented by the Formula (III) is from 10% by mass to 55% by mass; and
wherein the epoxy resin composition is solid at 25° C.

2. The epoxy resin composition according to claim 1, wherein the epoxy resin composition includes an antioxidant.

3. An electronic component device, comprising an element sealed by the epoxy resin composition according to claim 1.

4. The epoxy resin composition according to claim 1, wherein a ratio of a number of hydroxyl groups in the phenol resin to the number of epoxy groups in the epoxy resin component (A) is from 0.5 to 2.

5. The epoxy resin composition according to claim 1, wherein the epoxy resin component (A) consists of only the first compound represented by the Formula (I).

6. The epoxy resin composition according to claim 1, wherein the epoxy resin component (A) consists of at least 80% by mass, based on a total amount of the epoxy resin, of the first compound represented by the Formula (I) and the cresol novolac epoxy resin.

7. An epoxy resin composition, consisting of:
an epoxy resin component consisting of:
(1) a first compound represented by the following Formula (I), or
(2) an epoxy resin component consisting of:
   at least 80% by mass, based on a total amount of the epoxy resin, of the first compound represented by the following Formula (I); and
   a second epoxy compound having at least two epoxy groups per molecule, the second epoxy compound including a cresol novolac epoxy resin as the epoxy resin component,
a phenol resin including a compound represented by the following Formula (IV);
a dihydroxynaphthalene compound including a compound represented by the following Formula (III); and
optionally, one or more of an antioxidant, a curing accelerator, an inorganic filler, a coupling agent, an ion exchanger, a mold releasing agent, a stress relaxing agent, a flame retardant, and a colorant;

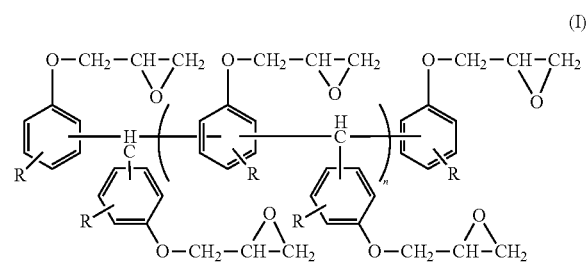

wherein, in the Formula (I), R represents a hydrogen atom, and n represents an integer from 0 to 10;

wherein, in the Formula (IV), $R^1$ represents a hydrogen atom, an alkyl group having from 1 to 6 carbon atoms, or an alkoxy group having 1 or 2 carbon atoms, and each $R^1$ may be the same as or different from another $R^1$, and n represents an integer from 0 to 10; and

wherein, in the Formula (III), $R^1$ represents a hydrogen atom, an alkyl group having from 1 to 6 carbon atoms, or an alkoxy group having 1 or 2 carbon atoms;

wherein a content of a total amount of the compound represented by the Formula (III) with respect to a total amount of the compound represented by the Formula (IV) and the compound represented by the Formula (III) is from 10% by mass to 55% by mass; and wherein the epoxy resin composition is solid at 25° C.

8. The epoxy resin composition according to claim 7, wherein the epoxy resin composition includes an antioxidant.

9. An electronic component device, comprising an element sealed by the epoxy resin composition according to claim 7.

10. The epoxy resin composition according to claim 7, wherein a ratio of a number of hydroxyl groups in the phenol resin to a number of epoxy groups in the epoxy resin component is from 0.5 to 2.

11. The epoxy resin composition according to claim 7, wherein the epoxy resin component consists of only the first compound represented by the Formula (I).

12. The epoxy resin composition according to claim 7, wherein the epoxy resin component consists of at least 80% by mass, based on a total amount of the epoxy resin, of the first compound represented by the Formula (I) and the cresol novolac epoxy resin.

* * * * *